US012804980B2

(12) United States Patent
Chen et al.

(10) Patent No.: US 12,804,980 B2
(45) Date of Patent: Nov. 17, 2026

(54) METHODS FOR SELECTIVE DEPOSITION OF PRECURSOR MATERIALS AND RELATED DEVICES

(71) Applicant: ENTEGRIS, INC., Billerica, MA (US)

(72) Inventors: Philip S. H. Chen, Bethel, CT (US); Shawn Duc Nguyen, Danbury, CT (US); Bryan Clark Hendrix, Danbury, CT (US)

(73) Assignee: Entegris, Inc., Billerica, MA (US)

( * ) Notice: Subject to any disclaimer, the term of this patent is extended or adjusted under 35 U.S.C. 154(b) by 428 days.

(21) Appl. No.: 18/387,228

(22) Filed: Nov. 6, 2023

(65) Prior Publication Data

US 2024/0170290 A1 May 23, 2024

Related U.S. Application Data

(60) Provisional application No. 63/427,357, filed on Nov. 22, 2022.

(51) Int. Cl.
*H10D 64/01* (2025.01)
*C23C 16/02* (2006.01)
(Continued)

(52) U.S. Cl.
CPC ... *H10D 64/01316* (2026.01); *C23C 16/0227* (2013.01); *C23C 16/08* (2013.01);
(Continued)

(58) Field of Classification Search
CPC ..... C23C 16/0227; C23C 16/08; C23C 16/42; C23C 16/045; C23C 16/18; C23C 16/308; C23C 16/34; C23C 16/4405; C23C 16/45525; C23C 16/56; C23C 16/0281; C23C 16/04; C23C 16/14; H10D 64/01316; H10D 30/014; H10D 30/6735; H10D 30/6757; H10D 64/0112; H10D 30/43;
(Continued)

(56) References Cited

U.S. PATENT DOCUMENTS

| | | | |
|---|---|---|---|
| 2016/0086850 | A1 | 3/2016 | Romero et al. |
| 2017/0037513 | A1 | 2/2017 | Haukka et al. |

(Continued)

FOREIGN PATENT DOCUMENTS

| | | | |
|---|---|---|---|
| JP | S60119750 A | 6/1985 | |
| JP | H0393223 A | 4/1991 | |
| JP | 2017222928 A | 12/2017 | |
| KR | 20210122693 A | 10/2021 | |

OTHER PUBLICATIONS

F. Nava, et al., "Impurity effects in molybdenum silicide formation," Thin Solid Films, 94(1982) 59-65.

(Continued)

*Primary Examiner* — Mouloucoulaye Inoussa

(57) ABSTRACT

Methods for selective deposition of precursor materials and related devices are provided. The methods comprise obtaining a structure. The structure comprises a non-dielectric material, and a dielectric material. The methods comprise contacting the structure with a molybdenum precursor under conditions, so as to obtain a molybdenum material on at least a portion of the non-dielectric material. The molybdenum material is not deposited on the dielectric material under the conditions.

26 Claims, 11 Drawing Sheets

(51) Int. Cl.

| | |
|---|---|
| ***C23C 16/08*** | (2006.01) |
| ***C23C 16/42*** | (2006.01) |
| ***H10D 30/43*** | (2025.01) |
| ***H10D 30/67*** | (2025.01) |
| ***H10D 62/10*** | (2025.01) |

(52) U.S. Cl.
CPC ............. *C23C 16/42* (2013.01); *H10D 30/43* (2025.01); *H10D 30/6735* (2025.01); *H10D 30/6757* (2025.01); *H10D 62/121* (2025.01)

(58) Field of Classification Search
CPC .. H10D 62/121; H10D 64/017; H10D 64/254; H10D 30/0198; H10D 62/151; H10D 64/251; H10D 64/665; H10P 14/432; H10P 14/418; H10P 72/0466; H10P 14/40; H10P 72/0452; H10P 50/283; H10P 50/285; B82Y 10/00; H10W 20/069; H10W 20/40; H10W 20/42; H10W 20/435; H10W 20/033; H10W 20/045; H10W 20/425; H10W 20/4403; H10W 20/4437; H10W 20/042; H10W 20/057; H10W 20/054; H10B 12/02; H10B 12/482; H10B 12/488; B08B 7/0035; B08B 9/00
See application file for complete search history.

(56) References Cited

U.S. PATENT DOCUMENTS

| | | | | |
|---|---|---|---|---|
| 2020/0283898 | A1 | 9/2020 | Choi et al. | |
| 2021/0257262 | A1* | 8/2021 | Khaderbad | H10D 84/0193 |
| 2022/0013662 | A1* | 1/2022 | Shen | H10D 30/62 |
| 2022/0089809 | A1* | 3/2022 | Komatsu | C23C 26/00 |
| 2022/0285515 | A1* | 9/2022 | Khaderbad | H10D 30/6735 |
| 2022/0359298 | A1* | 11/2022 | More | H10D 30/6735 |
| 2022/0359532 | A1* | 11/2022 | Yang | C23C 16/45523 |
| 2023/0015781 | A1* | 1/2023 | Someshwar | H10D 62/83 |
| 2023/0317789 | A1* | 10/2023 | Lavric | H10D 30/014<br>257/288 |
| 2023/0380145 | A1* | 11/2023 | Chen | H10B 12/02 |
| 2024/0006479 | A1* | 1/2024 | Yu | H10D 62/121 |
| 2024/0021673 | A1* | 1/2024 | Huang | H10D 64/017 |
| 2024/0047269 | A1* | 2/2024 | Na | C23C 16/08 |
| 2024/0055485 | A1* | 2/2024 | Chang | H10D 62/151 |
| 2025/0022751 | A1* | 1/2025 | Lee | C23C 16/045 |
| 2025/0179635 | A1* | 6/2025 | Thombare | C23C 16/45527 |
| 2025/0183041 | A1* | 6/2025 | Hsieh | C23C 16/045 |
| 2025/0226227 | A1* | 7/2025 | Austin | H10P 14/418 |

OTHER PUBLICATIONS

S. Inoue, et al., “Properties of molybdenum silicide film deposited by chemical vapor deposition,” Journal of the Electrochemical Society (1983), 130(7), 1603-7.

* cited by examiner

METHODS FOR SELECTIVE DEPOSITION OF PRECURSOR MATERIALS AND RELATED DEVICES

FIELD

The present disclosure relates to methods for selective deposition of precursor materials and related devices.

BACKGROUND

Fabrication of semiconductor components involves material deposition. Material deposition either fails or is non-uniform with respect to surfaces which are not readily accessible via conventional deposition processes.

SUMMARY

Some embodiments relate to a method. In some embodiments, the method comprises obtaining a structure. In some embodiments, the structure comprises a non-dielectric material. In some embodiments, the structure comprises a dielectric material. In some embodiments, the method comprises contacting the structure with a molybdenum precursor under conditions, so as to obtain a molybdenum material on at least a portion of the structure. In some embodiments, the molybdenum material is not deposited on the dielectric material under the conditions.

Some embodiments relate to a method. In some embodiments, the method comprises obtaining a structure. In some embodiments, the structure comprises a polysilicon. In some embodiments, the structure comprises a dielectric material. In some embodiments, the method comprises contacting the structure with a molybdenum precursor under first conditions, so as to obtain a molybdenum silicide on the polysilicon. In some embodiments, contacting the structure with the molybdenum precursor under second conditions, so as to obtain a molybdenum metal on the molybdenum silicide.

Some embodiments relate to a method. In some embodiments, the method comprises obtaining a structure. In some embodiments, the structure comprises a conducting material. In some embodiments, the structure comprises a dielectric material. In some embodiments, the method comprises contacting the structure with a molybdenum precursor under first conditions. In some embodiments, the molybdenum precursor removes a molybdenum oxide from at least a portion of the conducting material under the first conditions. In some embodiments, the method comprises contacting the structure with the molybdenum precursor under second conditions. In some embodiments, the molybdenum precursor deposits a molybdenum metal on at least a portion of the conducting material under second conditions.

BRIEF DESCRIPTION OF THE DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1:
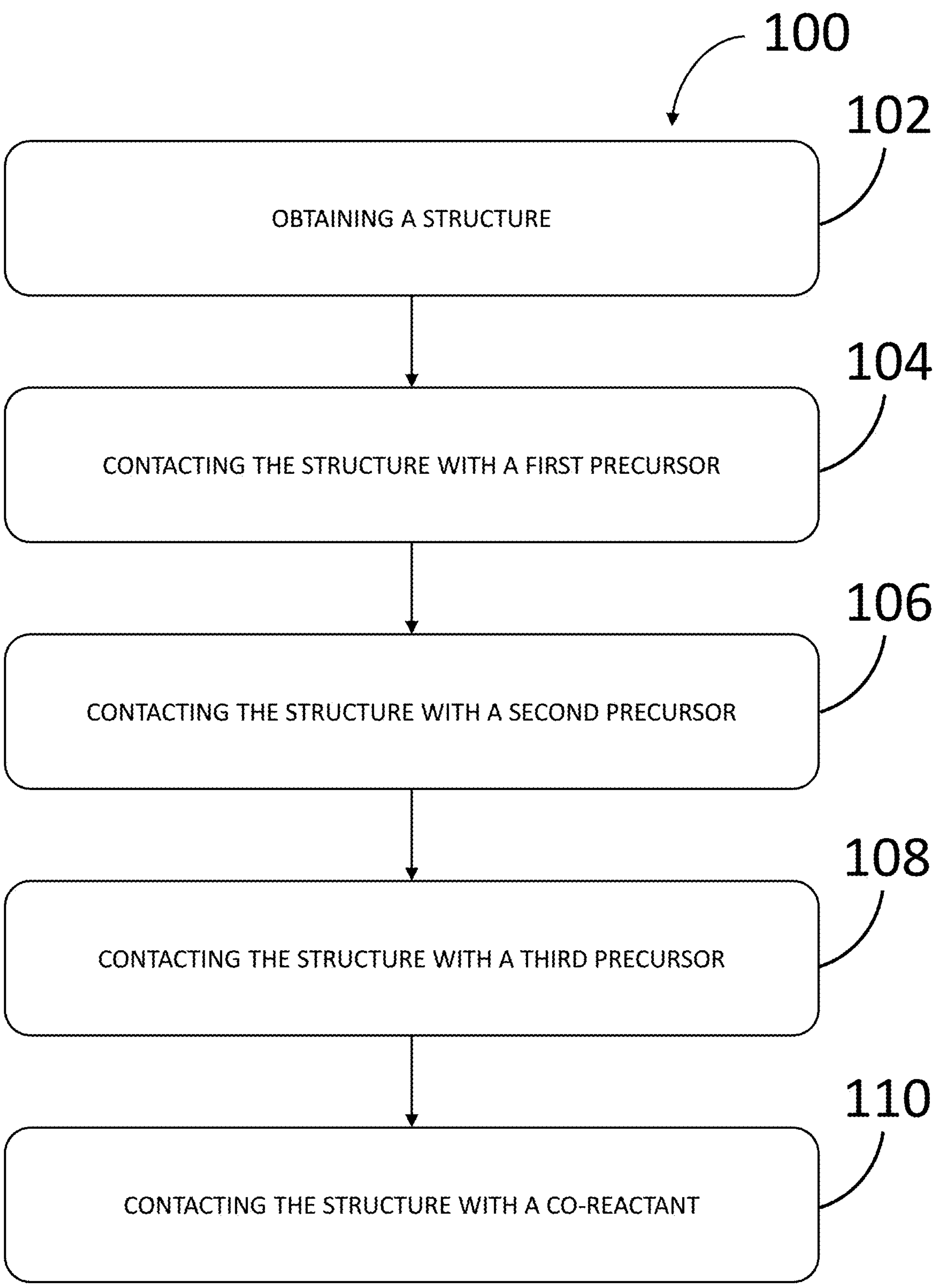
FIG. 1 is a flowchart of a method, according to some embodiments.

FIG. 1 is a flowchart of a method 100, according to some embodiments. As shown in FIG. 1, in some embodiments, the method 100 may comprise one or more of the following steps, in any order: a step 102 of obtaining a structure; a step 104 of contacting the structure with a first precursor under first conditions; a step 106 of contacting the structure with a second precursor under second conditions; a step 108 of contacting the structure with a third precursor under third conditions; and a step 110 of contacting the structure with a co-reactant precursor. In some embodiments, the method 100 comprises contacting the structure with a treatment solution so as to remove surface oxides. In some embodiments, the treatment solution comprises diluted hydrofluoric.

At step 102, in some embodiments, the method 100 comprises obtaining a structure. The structure may comprise a non-dielectric material. In some embodiments, the non-dielectric material comprises a semiconductor material. In some embodiments, the non-dielectric material comprises a semiconductor layer. In some embodiments, the semiconductor layer is a single layer, a crystalline layer, or any combination thereof. In some embodiments, the non-dielectric material comprises at least one of silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), indium phosphide (InP), or any combination thereof. In some embodiments, the non-dielectric material comprises silicon. In some embodiments, the non-dielectric material comprises polysilicon.

The structure may comprise a non-dielectric material. In some embodiments, the non-dielectric material is proximate to the dielectric material. In some embodiments, the non-dielectric material is a non-dielectric layer. In some embodiments, the non-dielectric material is a non-dielectric feature. In some embodiments, the non-dielectric material is a non-dielectric structure. In some embodiments, the non-dielectric material is a non-dielectric spacer. In some embodiments, the non-dielectric material comprises a semiconductor material. In some embodiments, the non-dielectric material comprises a conducting material. In some embodiments, the non-dielectric material is polycrystalline. In some embodiments, the non-dielectric material is amorphous. In some embodiments, the non-dielectric material is an epitaxial semiconductor material. In some embodiments, the non-dielectric material comprises molybdenum silicide. In some embodiments, the non-dielectric material comprises a metal. In some embodiments, the non-dielectric material comprises a metal nitride.

The structure may comprise a dielectric material. In some embodiments, the dielectric material is a dielectric layer. In some embodiments, the dielectric material is a dielectric feature. In some embodiments, the dielectric material is a dielectric structure. In some embodiments, the dielectric material is a dielectric spacer. In some embodiments, the dielectric material comprises at least one of $HfO_2$, $ZrO_2$, $HfAlO_x$, $HfSiO_x$, $Al_2O_3$, SiCN, SiOC, SiOCN, or any combination thereof. In some embodiments, a chemical vapor deposition process, a plasma-enhanced chemical vapor deposition process, a physical vapor deposition process, an atomic layer deposition process, or any combination thereof is employed so as to obtain the dielectric material of the structure.

It will be appreciated that the structure may comprise one or more additional elements, without departing from the scope of this disclosure. The structure may comprise all or a portion of a semiconductor device or semiconductor structure, among other things. Accordingly, the structure may include, for example and without limitation, at least one of the following: metal contacts, conducting nitrides (at least one of TiN, WN, TaN, NbN, MoN, or any combination thereof), or any combination thereof, among other things.

At step 104, in some embodiments, the method 100 comprises contacting the structure with the first precursor under the first conditions. The step of contacting the structure with the first precursor under the first conditions may be sufficient to obtain a first molybdenum material on at least a portion of the non-dielectric material. In some embodiments, the step of contacting the structure with the first precursor under the first conditions may be sufficient to deposit the first molybdenum material on at least a portion of the non-dielectric material. In some embodiments, the step of contacting the structure with the first precursor under the first conditions may be sufficient to form the first molybdenum material on at least a portion of the non-dielectric material. In some embodiments, at least a portion of the non-dielectric material is at least a portion of a surface of the non-dielectric material. In some embodiments, the first molybdenum material comprises molybdenum metal. In some embodiments, the first molybdenum material comprises element molybdenum or molybdenum of any oxidation state. In some embodiments, the first molybdenum material comprises molybdenum silicide. In some embodiments, the molybdenum silicide is represented by the formula MoSix, where x is 0.3 to 2. In some embodiments, x is 0.33. In some embodiments, x is 0.6. In some embodiments, x is 2. In some embodiments, the molybdenum silicide is non-crystalline. In some embodiments, the non-crystalline form of molybdenum silicide comprises an arbitrary ratio of Mo/Si.

The step of contacting the structure with the first precursor under the first conditions may exhibit a selectivity for the non-dielectric material over the dielectric material. For example, in some embodiments, the first molybdenum material is not obtained on the dielectric material under the first conditions. In some embodiments, the first molybdenum material is not deposited on the dielectric material under the first conditions. In some embodiments, the first molybdenum material comprises molybdenum metal. In some embodiments, the first molybdenum material comprises element molybdenum or molybdenum of any oxidation state. In some embodiments, the first molybdenum material comprises molybdenum silicide. In some embodiments, the molybdenum silicide is represented by the formula MoSix, where x is 0.3 to 2. In some embodiments, x is 0.33. In some embodiments, x is 0.6. In some embodiments, x is 2. In some embodiments, the molybdenum silicide is non-crystalline. In some embodiments, the non-crystalline form of molybdenum silicide comprises an arbitrary ratio of Mo/Si.

The first molybdenum material may be a reaction product of the first molybdenum precursor with another component. For example, in some embodiments, the first molybdenum material is the reaction product of the first molybdenum precursor and at least one co-reactant. In some embodiments, the co-reactant comprises hydrogen ($H_2$). In some embodiments, the co-reactant comprises at least one of argon (Ar), helium (He), nitrogen ($N_2$), or any combination thereof. In some embodiments, the molybdenum material is the reaction product of the first molybdenum precursor and the non-dielectric material. For example, in some embodiments, the molybdenum material comprises molybdenum silicide. In some embodiments, the molybdenum silicide is a reaction product of the first molybdenum precursor and the polysilicon of the non-dielectric material. In some embodiments, the first molybdenum material is not a reaction product.

The first molybdenum material may comprise molybdenum metal with high purity. In some embodiments, the molybdenum metal has a purity of at least 90%, at least 91%, at least 92%, at least 93%, at least 94%, at least 95%, at least 96%, at least 97%, at least 98%, at least 99%, at least 99.9%, at least 99.99%, at least 99.999%, or at least 99.9999%. In some embodiments, the molybdenum metal has a purity of 90% to 100%.

The first conditions may comprise at least one of a first temperature, a first pressure, a first flow rate, or any combination thereof. The first temperature may be a temperature of 100° C. to 600° C., or any range or subrange therebetween. In some embodiments, the first temperature is a temperature of 100° C. to 580° C., 100° C. to 560° C., 100° C. to 540° C., 100° C. to 520° C., 100° C. to 500° C., 100° C. to 480° C., 100° C. to 460° C., 100° C. to 440° C., 100° C. to 420° C., 100° C. to 400° C., 100° C. to 380° C., 100° C. to 360° C., 100° C. to 340° C., 100° C. to 320° C., 100° C. to 300° C., 100° C. to 280° C., 100° C. to 260° C., 100° C. to 240° C., 100° C. to 220° C., 100° C. to 200° C., 100° C. to 180° C., 100° C. to 160° C., 100° C. to 140° C., or 100° C. to 120° C. In some embodiments, the first temperature is a temperature in a range of 120° C. to 600° C., 140° C. to 600° C., 160° C. to 600° C., 180° C. to 600° C., 200° C. to 600° C., 220° C. to 600° C., 240° C. to 600° C., 260° C. to 600° C., 280° C. to 600° C., 300° C. to 600° C., 320° C. to 600° C., 340° C. to 600° C., 360° C. to 600° C., 380° C. to 600° C., 400° C. to 600° C., 420° C. to 600° C., 440° C. to 600° C., 460° C. to 600° C., 480° C. to 600° C., 500° C. to 600° C., 520° C. to 600° C., 540° C. to 600° C., 560° C. to 600° C., or 580° C. to 600° C.

In some embodiments, the first temperature is a temperature of 400° C. or less. In some embodiments, the first temperature is a temperature of 100° C. to 400° C., 100° C. to 380° C., 100° C. to 360° C., 100° C. to 340° C., 100° C. to 320° C., 100° C. to 300° C., 100° C. to 280° C., 100° C. to 260° C., 100° C. to 240° C., 100° C. to 220° C., 100° C. to 200° C., 100° C. to 180° C., 100° C. to 160° C., 100° C. to 140° C., or 100° C. to 120° C. In some embodiments, the first temperature is a temperature of 120° C. to 400° C., 140° C. to 400° C., 160° C. to 400° C., 180° C. to 400° C., 200° C. to 400° C., 220° C. to 400° C., 240° C. to 400° C., 260° C. to 400° C., 280° C. to 400° C., 300° C. to 400° C., 320° C. to 400° C., 340° C. to 400° C., 360° C. to 400° C., or 380° C. to 400° C.

In some embodiments, the first temperature is a temperature of greater than 400° C. In some embodiments, the first temperature is a temperature of 400° C. to 600° C., 400° C. to 580° C., 400° C. to 560° C., 400° C. to 540° C., 400° C. to 520° C., 400° C. to 500° C., 400° C. to 480° C., 400° C. to 460° C., 400° C. to 440° C., or 400° C. to 420° C. In some embodiments, the first temperature is a temperature of 420° C. to 600° C., 440° C. to 600° C., 460° C. to 600° C., 480° C. to 600° C., 500° C. to 600° C., 520° C. to 600° C., 540° C. to 600° C., 560° C. to 600° C., or 580° C. to 600° C.

The first pressure may comprise a pressure of 1 Torr to 100 Torr, or any range or subrange therebetween. In some embodiments, the first pressure is a pressure of 1 Torr to 90 Torr, 1 Torr to 80 Torr, 1 Torr to 70 Torr, 1 Torr to 60 Torr, 1 Torr to 50 Torr, 1 Torr to 40 Torr, 1 Torr to 30 Torr, 1 Torr to 20 Torr, 1 Torr to 10 Torr, or 1 Torr to 5 Torr. In some embodiments, the first pressure is a pressure of 5 Torr to 100 Torr, 10 Torr to 100 Torr, 20 Torr to 100 Torr, 30 Torr to 100 Torr, 40 Torr to 100 Torr, 50 Torr to 100 Torr, 60 Torr to 100 Torr, 70 Torr to 100 Torr, 80 Torr to 100 Torr, or 90 Torr to 100 Torr.

The first flow rate may comprise a flow rate of 0.01 sccm to 10 sccm, or any range or subrange therebetween. In some embodiments, the first flow rate is a flow rate of 0.1 sccm to 10 sccm, 0.2 sccm to 10 sccm, 0.3 sccm to 10 sccm, 0.4 sccm to 10 sccm, 0.5 sccm to 10 sccm, 0.6 sccm to 10 sccm, 0.7 sccm to 10 sccm, 0.8 sccm to 10 sccm, 0.9 sccm to 10 sccm, 1 sccm to 10 sccm, 2 sccm to 10 sccm, sccm to 10 sccm, 3 sccm to 10 sccm, 4 sccm to 10 sccm, 5 sccm to 10 sccm, 6 sccm to 10 sccm, 7 sccm to 10 sccm, 8 sccm to 10 sccm, or 9 sccm to 10 sccm. In some embodiments, the first flow rate is a flow rate of 0.01 sccm to 9 sccm, 0.01 sccm to 8 sccm, 0.01 sccm to 7 sccm, 0.01 sccm to 6 sccm, 0.01 sccm to 5 sccm, 0.01 sccm to 4 sccm, 0.01 sccm to 3 sccm, 0.01 sccm to 2 sccm, 0.01 sccm to 1 sccm, 0.01 sccm to 0.9 sccm, 0.01 sccm to 0.8 sccm, 0.01 sccm to 0.7 sccm, 0.01 sccm to 0.6 sccm, 0.01 sccm to 0.5 sccm, 0.01 sccm to 0.4 sccm, 0.01 sccm to 0.3 sccm, 0.01 sccm to 0.2 sccm, or 0.01 sccm to 0.1 sccm.

At step 106, in some embodiments, the method 100 comprises contacting the structure with the second precursor under the second conditions. The step of contacting the structure with the second precursor under the second conditions may be sufficient to obtain a second molybdenum material on at least a portion of the non-dielectric material. In some embodiments, the step of contacting the structure with the second precursor under the second conditions may be sufficient to deposit the second molybdenum material on at least a portion of the non-dielectric material. In some embodiments, the step of contacting the structure with the second precursor under the second conditions may be sufficient to form the second molybdenum material on at least a portion of the non-dielectric material. In some embodiments, the second molybdenum material comprises molybdenum metal. In some embodiments, the second molybdenum material comprises element molybdenum or molybdenum of any oxidation state. In some embodiments, the second molybdenum material comprises molybdenum silicide. In some embodiments, the molybdenum silicide is represented by the formula MoSix, where x is 0.3 to 2. In some embodiments, x is 0.33. In some embodiments, x is 0.6. In some embodiments, x is 2. In some embodiments, the molybdenum silicide is non-crystalline. In some embodiments, the non-crystalline form of molybdenum silicide comprises an arbitrary ratio of Mo/Si.

The step of contacting the structure with the second precursor under the second conditions may be sufficient to obtain a second molybdenum material on at least a portion of the first molybdenum material. In some embodiments, the step of contacting the structure with the second precursor under the second conditions may be sufficient to deposit the second molybdenum material on at least a portion of the first molybdenum material. In some embodiments, the step of contacting the structure with the second precursor under the second conditions may be sufficient to form the second molybdenum material on at least a portion of the first molybdenum material. In some embodiments, at least a portion of the first molybdenum material is at least a portion of a surface of the first molybdenum material. In some embodiments, the second molybdenum material comprises molybdenum metal. In some embodiments, the second molybdenum material comprises element molybdenum or molybdenum of any oxidation state. In some embodiments, the second molybdenum material comprises molybdenum silicide. In some embodiments, the molybdenum silicide is represented by the formula MoSix, where x is 0.3 to 2. In some embodiments, x is 0.33. In some embodiments, x is 0.6. In some embodiments, x is 2. In some embodiments, the molybdenum silicide is non-crystalline. In some embodiments, the non-crystalline form of molybdenum silicide comprises an arbitrary ratio of Mo/Si.

The step of contacting the structure with the second precursor under the second conditions may exhibit a selectivity for the non-dielectric material over the dielectric material. The step of contacting the structure with the second precursor under the second conditions may exhibit a selectivity for the first molybdenum material over the dielectric material. For example, in some embodiments, the second molybdenum material is not obtained on the dielectric material under the second conditions. In some embodiments, the second molybdenum material is not deposited on the dielectric material under the second conditions. In some embodiments, the second molybdenum material comprises molybdenum metal. In some embodiments, the second molybdenum material comprises element molybdenum or molybdenum of any oxidation state. In some embodiments, the second molybdenum material comprises molybdenum silicide. In some embodiments, the molybdenum silicide is represented by the formula MoSix, where x is 0.3 to 2. In some embodiments, x is 0.33. In some embodiments, x is 0.6. In some embodiments, x is 2. In some embodiments, the molybdenum silicide is non-crystalline. In some embodiments, the non-crystalline form of molybdenum silicide comprises an arbitrary ratio of Mo/Si.

The second molybdenum material may be a reaction product of the second molybdenum precursor with another component. For example, in some embodiments, the molybdenum material is the reaction product of the second molybdenum precursor and at least one co-reactant. In some embodiments, the co-reactant comprises hydrogen ($H_2$). In some embodiments, the co-reactant comprises at least one of argon (Ar), helium (He), nitrogen ($N_2$), or any combination thereof. In some embodiments, the molybdenum material is the reaction product of the second molybdenum precursor and the non-dielectric material. For example, in some embodiments, the molybdenum material comprises molybdenum silicide. In some embodiments, the molybdenum silicide is a reaction product of the second molybdenum precursor and the polysilicon of the non-dielectric material. In some embodiments, the second molybdenum material is not a reaction product.

The second molybdenum material may comprise molybdenum metal with high purity. In some embodiments, the molybdenum metal has a purity of at least 90%, at least 91%, at least 92%, at least 93%, at least 94%, at least 95%, at least 96%, at least 97%, at least 98%, at least 99%, at least 99.9%, at least 99.99%, at least 99.999%, or at least 99.9999%. In some embodiments, the molybdenum metal has a purity of 90% to 100%.

The second conditions may comprise at least one of a second temperature, a second pressure, a second flow rate, or any combination thereof. The second temperature may be a temperature of 100° C. to 600° C., or any range or subrange therebetween. In some embodiments, the second temperature is a temperature of 100° C. to 580° C., 100° C. to 560° C., 100° C. to 540° C., 100° C. to 520° C., 100° C. to 500° C., 100° C. to 480° C., 100° C. to 460° C., 100° C. to 440° C., 100° C. to 420° C., 100° C. to 400° C., 100° C. to 380° C., 100° C. to 360° C., 100° C. to 340° C., 100° C. to 320° C., 100° C. to 300° C., 100° C. to 280° C., 100° C. to 260° C., 100° C. to 240° C., 100° C. to 220° C., 100° C. to 200° C., 100° C. to 180° C., 100° C. to 160° C., 100° C. to 140° C., or 100° C. to 120° C. In some embodiments, the second temperature is a temperature in a range of 120° C. to 600° C., 140° C. to 600° C., 160° C. to 600° C., 180° C. to 600° C., 200° C. to 600° C., 220° C. to 600° C., 240° C. to 600° C., 260° C. to 600° C., 280° C. to 600° C., 300° C. to 600° C., 320° C. to 600° C., 340° C. to 600° C., 360° C. to 600° C., 380° C. to 600° C., 400° C. to 600° C., 420° C. to 600° C., 440° C. to 600° C., 460° C. to 600° C., 480° C. to 600° C., 500° C. to 600° C., 520° C. to 600° C., 540° C. to 600° C., 560° C. to 600° C., or 580° C. to 600° C.

In some embodiments, the second temperature is a temperature of 400° C. or less. In some embodiments, the second temperature is a temperature of 100° C. to 400° C., 100° C. to 380° C., 100° C. to 360° C., 100° C. to 340° C., 100° C. to 320° C., 100° C. to 300° C., 100° C. to 280° C., 100° C. to 260° C., 100° C. to 240° C., 100° C. to 220° C., 100° C. to 200° C., 100° C. to 180° C., 100° C. to 160° C., 100° C. to 140° C., or 100° C. to 120° C. In some embodiments, the second temperature is a temperature of 120° C. to 400° C., 140° C. to 400° C., 160° C. to 400° C., 180° C. to 400° C., 200° C. to 400° C., 220° C. to 400° C., 240° C. to 400° C., 260° C. to 400° C., 280° C. to 400° C., 300° C. to 400° C., 320° C. to 400° C., 340° C. to 400° C., 360° C. to 400° C., or 380° C. to 400° C.

In some embodiments, the second temperature is a temperature of greater than 400° C. In some embodiments, the second temperature is a temperature of 400° C. to 600° C., 400° C. to 580° C., 400° C. to 560° C., 400° C. to 540° C., 400° C. to 520° C., 400° C. to 500° C., 400° C. to 480° C., 400° C. to 460° C., 400° C. to 440° C., or 400° C. to 420° C. In some embodiments, the second temperature is a temperature of 420° C. to 600° C., 440° C. to 600° C., 460° C. to 600° C., 480° C. to 600° C., 500° C. to 600° C., 520° C. to 600° C., 540° C. to 600° C., 560° C. to 600° C., or 580° C. to 600° C.

In some embodiments, the second temperature is greater than the first temperature. In some embodiments, the second temperature is less than the first temperature.

The second pressure may comprise a pressure of 1 Torr to 100 Torr, or any range or subrange therebetween. In some embodiments, the second pressure is a pressure of 1 Torr to 90 Torr, 1 Torr to 80 Torr, 1 Torr to 70 Torr, 1 Torr to 60 Torr, 1 Torr to 50 Torr, 1 Torr to 40 Torr, 1 Torr to 30 Torr, 1 Torr to 20 Torr, 1 Torr to 10 Torr, or 1 Torr to 5 Torr. In some embodiments, the second pressure is a pressure of 5 Torr to 100 Torr, 10 Torr to 100 Torr, 20 Torr to 100 Torr, 30 Torr to 100 Torr, 40 Torr to 100 Torr, 50 Torr to 100 Torr, 60 Torr to 100 Torr, 70 Torr to 100 Torr, 80 Torr to 100 Torr, or 90 Torr to 100 Torr.

In some embodiments, the second pressure is greater than the first pressure. In some embodiments, the second pressure is less than the first pressure.

The second flow rate may comprise a flow rate of 0.01 sccm to 10 sccm, or any range or subrange therebetween. In some embodiments, the second flow rate is a flow rate of 0.1 sccm to 10 sccm, 0.2 sccm to 10 sccm, 0.3 sccm to 10 sccm, 0.4 sccm to 10 sccm, 0.5 sccm to 10 sccm, 0.6 sccm to 10 sccm, 0.7 sccm to 10 sccm, 0.8 sccm to 10 sccm, 0.9 sccm to 10 sccm, 1 sccm to 10 sccm, 2 sccm to 10 sccm, sccm to 10 sccm, 3 sccm to 10 sccm, 4 sccm to 10 sccm, 5 sccm to 10 sccm, 6 sccm to 10 sccm, 7 sccm to 10 sccm, 8 sccm to 10 sccm, or 9 sccm to 10 sccm. In some embodiments, the second flow rate is a flow rate of 0.01 sccm to 9 sccm, 0.01 sccm to 8 sccm, 0.01 sccm to 7 sccm, 0.01 sccm to 6 sccm, 0.01 sccm to 5 sccm, 0.01 sccm to 4 sccm, 0.01 sccm to 3 sccm, 0.01 sccm to 2 sccm, 0.01 sccm to 1 sccm, 0.01 sccm to 0.9 sccm, 0.01 sccm to 0.8 sccm, 0.01 sccm to 0.7 sccm, 0.01 sccm to 0.6 sccm, 0.01 sccm to 0.5 sccm, 0.01 sccm to 0.4 sccm, 0.01 sccm to 0.3 sccm, 0.01 sccm to 0.2 sccm, or 0.01 sccm to 0.1 sccm.

In some embodiments, the second flow rate is greater than the first flow rate. In some embodiments, the second flow rate is less than the first flow rate.

In some embodiments, the first conditions and the second conditions are the same, such that a molybdenum silicide is obtained on the polysilicon and such that a molybdenum metal is obtained on the molybdenum silicide in a single step.

In some embodiments, the first conditions and the second conditions have the same temperature. In some embodiments, the first conditions and the second conditions have the same pressure. In some embodiments, the first conditions and the second conditions have the same precursor flowrate. In some embodiments, the first conditions and the second conditions have the same co-reactant flowrate.

At step 108, in some embodiments, the method 100 comprises contacting the structure with the third precursor under the third conditions. The step of contacting the structure with the third precursor under the third conditions may be sufficient to remove at least a portion of the metal oxides on the non-dielectric material. In some embodiments, the step of contacting the structure with the third precursor under the third conditions may be sufficient to etch at least a portion of the metal oxides on the non-dielectric material. In some embodiments, the step of contacting the structure with the third precursor under the third conditions may be sufficient to degrade at least a portion of the metal oxides on the non-dielectric material. In some embodiments, the step of contacting the structure with the third precursor under the third conditions may be sufficient to etch at least a portion of the metal oxides on the non-dielectric material.

The step of contacting the structure with the third precursor under the third conditions may be sufficient to remove at least a portion of the metal oxides on the first molybdenum material. In some embodiments, the step of contacting the structure with the third precursor under the third conditions may be sufficient to etch at least a portion of the metal oxides on the first molybdenum material. In some embodiments, the step of contacting the structure with the third precursor under the third conditions may be sufficient to degrade at least a portion of the metal oxides on the first molybdenum material. In some embodiments, the step of contacting the structure with the third precursor under the third conditions may be sufficient to etch at least a portion of the metal oxides on the first molybdenum material.

The step of contacting the structure with the third precursor under the third conditions may be sufficient to remove at least a portion of the metal oxides on the second molybdenum material. In some embodiments, the step of contacting the structure with the third precursor under the third conditions may be sufficient to etch at least a portion of the metal oxides on the second molybdenum material. In some embodiments, the step of contacting the structure with the third precursor under the third conditions may be sufficient to degrade at least a portion of the metal oxides on the second molybdenum material. In some embodiments, the step of contacting the structure with the third precursor under the third conditions may be sufficient to etch at least a portion of the metal oxides on the second molybdenum material.

The step of contacting the structure with the third precursor under the third conditions may be sufficient to obtain a third molybdenum material on at least a portion of the non-dielectric material. In some embodiments, the step of contacting the structure with the third precursor under the third conditions may be sufficient to deposit the third molybdenum material on at least a portion of the non-dielectric material. In some embodiments, the step of contacting the structure with the third precursor under the third conditions may be sufficient to form the third molybdenum material on at least a portion of the non-dielectric material. In some embodiments, at least a portion of the non-dielectric material is at least a portion of a surface of the non-dielectric material. In some embodiments, the third molybdenum material comprises molybdenum metal. In some embodiments, the third molybdenum material comprises element molybdenum or molybdenum of any oxidation state. In some embodiments, the third molybdenum material comprises molybdenum silicide. In some embodiments, the molybdenum silicide is represented by the formula $MoSi_x$, where x is 0.3 to 2. In some embodiments, x is 0.33. In some embodiments, x is 0.6. In some embodiments, x is 2. In some embodiments, the molybdenum silicide is non-crystalline. In some embodiments, the non-crystalline form of molybdenum silicide comprises an arbitrary ratio of Mo/Si.

The step of contacting the structure with the third precursor under the third conditions may be sufficient to obtain a third molybdenum material on at least a portion of the first molybdenum material. In some embodiments, the step of contacting the structure with the third precursor under the third conditions may be sufficient to deposit the third molybdenum material on at least a portion of the first molybdenum material. In some embodiments, the step of contacting the structure with the third precursor under the third conditions may be sufficient to form the third molybdenum material on at least a portion of the first molybdenum material. In some embodiments, the third molybdenum material comprises molybdenum metal. In some embodiments, the third molybdenum material comprises element molybdenum or molybdenum of any oxidation state. In some embodiments, the third molybdenum material comprises molybdenum silicide. In some embodiments, the molybdenum silicide is represented by the formula $MoSi_x$, where x is 0.3 to 2. In some embodiments, x is 0.33. In some embodiments, x is 0.6. In some embodiments, x is 2. In some embodiments, the molybdenum silicide is non-crystalline. In some embodiments, the non-crystalline form of molybdenum silicide comprises an arbitrary ratio of Mo/Si.

The step of contacting the structure with the third precursor under the third conditions may exhibit a selectivity for the non-dielectric material over the dielectric material. The step of contacting the structure with the third precursor under the third conditions may exhibit a selectivity for the first molybdenum material over the dielectric material. For example, in some embodiments, the third molybdenum material is not obtained on the dielectric material under the third conditions. In some embodiments, the third molybdenum material is not deposited on the dielectric material under the third conditions. In some embodiments, the third molybdenum material comprises molybdenum metal. In some embodiments, the third molybdenum material comprises element molybdenum or molybdenum of any oxidation state. In some embodiments, the third molybdenum material comprises molybdenum silicide. In some embodiments, the molybdenum silicide is represented by the formula $MoSi_x$, where x is 0.3 to 2. In some embodiments, x is 0.33. In some embodiments, x is 0.6. In some embodiments, x is 2. In some embodiments, the molybdenum silicide is non-crystalline. In some embodiments, the non-crystalline form of molybdenum silicide comprises an arbitrary ratio of Mo/Si.

The third molybdenum material may be a reaction product of the third molybdenum precursor with another component. For example, in some embodiments, the molybdenum material is the reaction product of the third molybdenum precursor and at least one co-reactant. In some embodiments, the co-reactant comprises hydrogen ($H_2$). In some embodiments, the co-reactant comprises at least one of argon (Ar), helium (He), nitrogen ($N_2$), or any combination thereof. In some embodiments, the molybdenum material is the reaction product of the third molybdenum precursor and the non-dielectric material. For example, in some embodiments, the molybdenum material comprises molybdenum silicide. In some embodiments, the molybdenum silicide is a reaction product of the third molybdenum precursor and the polysilicon of the non-dielectric material. In some embodiments, the third molybdenum material is not a reaction product.

The third molybdenum material may comprise molybdenum metal with high purity. In some embodiments, the molybdenum metal has a purity of at least 90%, at least 91%, at least 92%, at least 93%, at least 94%, at least 95%, at least 96%, at least 97%, at least 98%, at least 99%, at least 99.9%, at least 99.99%, at least 99.999%, or at least 99.9999%. In some embodiments, the molybdenum metal has a purity of 90% to 100%.

The third conditions may comprise at least one of a third temperature, a third pressure, a third flow rate, or any combination thereof. The third temperature may be a temperature of 100° C. to 600° C., or any range or subrange therebetween. In some embodiments, the third temperature is a temperature of 100° C. to 580° C., 100° C. to 560° C., 100° C. to 540° C., 100° C. to 520° C., 100° C. to 500° C., 100° C. to 480° C., 100° C. to 460° C., 100° C. to 440° C., 100° C. to 420° C., 100° C. to 400° C., 100° C. to 380° C., 100° C. to 360° C., 100° C. to 340° C., 100° C. to 320° C., 100° C. to 300° C., 100° C. to 280° C., 100° C. to 260° C., 100° C. to 240° C., 100° C. to 220° C., 100° C. to 200° C., 100° C. to 180° C., 100° C. to 160° C., 100° C. to 140° C., or 100° C. to 120° C. In some embodiments, the third temperature is a temperature in a range of 120° C. to 600° C., 140° C. to 600° C., 160° C. to 600° C., 180° C. to 600° C., 200° C. to 600° C., 220° C. to 600° C., 240° C. to 600° C., 260° C. to 600° C., 280° C. to 600° C., 300° C. to 600° C., 320° C. to 600° C., 340° C. to 600° C., 360° C. to 600° C., 380° C. to 600° C., 400° C. to 600° C., 420° C. to 600° C., 440° C. to 600° C., 460° C. to 600° C., 480° C. to 600° C., 500° C. to 600° C., 520° C. to 600° C., 540° C. to 600° C., 560° C. to 600° C., or 580° C. to 600° C.

In some embodiments, the third temperature is a temperature of 400° C. or less. In some embodiments, the third temperature is a temperature of 100° C. to 400° C., 100° C. to 380° C., 100° C. to 360° C., 100° C. to 340° C., 100° C. to 320° C., 100° C. to 300° C., 100° C. to 280° C., 100° C. to 260° C., 100° C. to 240° C., 100° C. to 220° C., 100° C. to 200° C., 100° C. to 180° C., 100° C. to 160° C., 100° C. to 140° C., or 100° C. to 120° C. In some embodiments, the third temperature is a temperature of 120° C. to 400° C., 140° C. to 400° C., 160° C. to 400° C., 180° C. to 400° C., 200° C. to 400° C., 220° C. to 400° C., 240° C. to 400° C., 260° C. to 400° C., 280° C. to 400° C., 300° C. to 400° C., 320° C. to 400° C., 340° C. to 400° C., 360° C. to 400° C., or 380° C. to 400° C.

In some embodiments, the third temperature is a temperature of greater than 400° C. In some embodiments, the third temperature is a temperature of 400° C. to 600° C., 400° C. to 580° C., 400° C. to 560° C., 400° C. to 540° C., 400° C. to 520° C., 400° C. to 500° C., 400° C. to 480° C., 400° C. to 460° C., 400° C. to 440° C., or 400° C. to 420° C. In some embodiments, the third temperature is a temperature of 420° C. to 600° C., 440° C. to 600° C., 460° C. to 600° C., 480° C. to 600° C., 500° C. to 600° C., 520° C. to 600° C., 540° C. to 600° C., 560° C. to 600° C., or 580° C. to 600° C.

In some embodiments, the third temperature is greater than the first temperature. In some embodiments, the third temperature is greater than the second temperature. In some embodiments, the third temperature is less than the first temperature. In some embodiments, the third temperature is less than the second temperature.

The third pressure may comprise a pressure of 1 Torr to 100 Torr, or any range or subrange therebetween. In some embodiments, the third pressure is a pressure of 1 Torr to 90 Torr, 1 Torr to 80 Torr, 1 Torr to 70 Torr, 1 Torr to 60 Torr, 1 Torr to 50 Torr, 1 Torr to 40 Torr, 1 Torr to 30 Torr, 1 Torr to 20 Torr, 1 Torr to 10 Torr, or 1 Torr to 5 Torr. In some embodiments, the third pressure is a pressure of 5 Torr to 100 Torr, 10 Torr to 100 Torr, 20 Torr to 100 Torr, 30 Torr to 100 Torr, 40 Torr to 100 Torr, 50 Torr to 100 Torr, 60 Torr to 100 Torr, 70 Torr to 100 Torr, 80 Torr to 100 Torr, or 90 Torr to 100 Torr.

In some embodiments, the third pressure is greater than the first pressure. In some embodiments, the third pressure is less than the first pressure. In some embodiments, the third pressure is greater than the second pressure. In some embodiments, the third pressure is less than the second pressure.

The third flow rate may comprise a flow rate of 0.01 sccm to 10 sccm, or any range or subrange therebetween. In some embodiments, the third flow rate is a flow rate of 0.1 sccm to 1 sccm, 0.1 sccm to 10 sccm, 0.2 sccm to 10 sccm, 0.3 sccm to 10 sccm, 0.4 sccm to 10 sccm, 0.5 sccm to 10 sccm, 0.6 sccm to 10 sccm, 0.7 sccm to 10 sccm, 0.8 sccm to 10 sccm, 0.9 sccm to 10 sccm, 1 sccm to 10 sccm, 2 sccm to 10 sccm, sccm to 10 sccm, 3 sccm to 10 sccm, 4 sccm to 10 sccm, 5 sccm to 10 sccm, 6 sccm to 10 sccm, 7 sccm to 10 sccm, 8 sccm to 10 sccm, or 9 sccm to 10 sccm. In some embodiments, the third flow rate is a flow rate of 0.01 sccm to 9 sccm, 0.01 sccm to 8 sccm, 0.01 sccm to 7 sccm, 0.01 sccm to 6 sccm, 0.01 sccm to 5 sccm, 0.01 sccm to 4 sccm, 0.01 sccm to 3 sccm, 0.01 sccm to 2 sccm, 0.01 sccm to 1 sccm, 0.01 sccm to 0.9 sccm, 0.01 sccm to 0.8 sccm, 0.01 sccm to 0.7 sccm, 0.01 sccm to 0.6 sccm, 0.01 sccm to 0.5 sccm, 0.01 sccm to 0.4 sccm, 0.01 sccm to 0.3 sccm, 0.01 sccm to 0.2 sccm, or 0.01 sccm to 0.1 sccm.

In some embodiments, the third flow rate is greater than the first flow rate. In some embodiments, the third flow rate is less than the first flow rate. In some embodiments, the third flow rate is greater than the second flow rate. In some embodiments, the third flow rate is less than the second flow rate.

At step 110, in some embodiments, the method 100 comprises contacting the structure with a co-reactant precursor. In some embodiments, the co-reactant precursor is contacted with the structure under the first conditions. In some embodiments, the co-reactant precursor is contacted with the non-dielectric material in co-flow with the first molybdenum precursor. In some embodiments, the co-reactant precursor is contacted with the structure under the second conditions. In some embodiments, the co-reactant precursor is contacted with the non-dielectric material in co-flow with the second molybdenum precursor. In some embodiments, the co-reactant precursor is contacted with the structure under the third conditions. In some embodiments, the co-reactant precursor is contacted with the non-dielectric material in co-flow with the third molybdenum precursor. In some embodiments, the co-reactant comprises hydrogen ($H_2$). In some embodiments, the co-reactant comprises at least one of argon (Ar), helium (He), nitrogen ($N_2$), or any combination thereof.

The flow rate of the co-reactant precursor may comprise a flow rate of 50 sccm to 1000 sccm, or any range or subrange therebetween. In some embodiments, the flow rate of the co-reactant precursor comprises a flow rate of 50 sccm to 950 sccm, 50 sccm to 900 sccm, 50 sccm to 850 sccm, 50 sccm to 800 sccm, 50 sccm to 750 sccm, 50 sccm to 700 sccm, 50 sccm to 650 sccm, 50 sccm to 600 sccm, 50 sccm to 550 sccm, 50 sccm to 500 sccm, 50 sccm to 450 sccm, 50 sccm to 400 sccm, 50 sccm to 350 sccm, 50 sccm to 300 sccm, 50 sccm to 250 sccm, 50 sccm to 200 sccm, 50 sccm to 150 sccm, or 50 sccm to 100 sccm. In some embodiments, the flow rate of the co-reactant precursor comprises a flow rate of 100 sccm to 1000 sccm, 150 sccm to 1000 sccm, 200 sccm to 1000 sccm, 250 sccm to 1000 sccm, 300 sccm to 1000 sccm, 350 sccm to 1000 sccm, 400 sccm to 1000 sccm, 450 sccm to 1000 sccm, 500 sccm to 1000 sccm, 550 sccm to 1000 sccm, 600 sccm to 1000 sccm, 650 sccm to 1000 sccm, 700 sccm to 1000 sccm, 750 sccm to 1000 sccm, 800 sccm to 1000 sccm, 850 sccm to 1000 sccm, 900 sccm to 1000 sccm, or 950 sccm to 1000 sccm.

Figure 2:
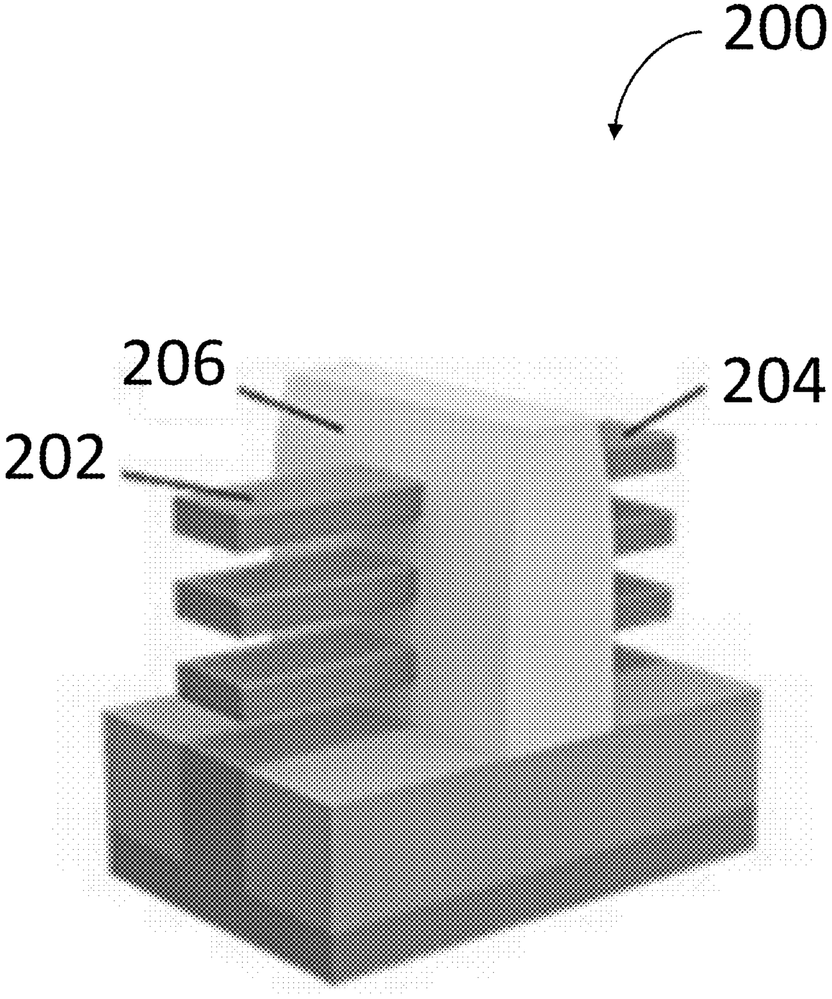
FIG. 2 is a schematic diagram of a device, according to some embodiments.

FIG. 2 is a schematic diagram of a device 200, according to some embodiments. As shown in FIG. 2, the device 200 comprises a transistor in a nanosheet configuration. In some embodiments, the device 200 comprises a source 202 and a drain 204. In some embodiments, the device 200 comprises a gate 206. In some embodiments, the source 202 comprises a non-dielectric material comprising polysilicon. In some embodiments, the source 202 comprises a non-dielectric material comprising silicon. In some embodiments, the drain 204 comprises a non-dielectric material comprising polysilicon. In some embodiments, the drain 204 comprises a non-dielectric material comprising silicon. In some embodiments, the gate 206 comprises a dielectric material. In some embodiments, any one or more of the methods disclosed herein may be employed to obtain a molybdenum material on at least one of the source 202, the drain 204, or any combination thereof. It will be appreciated that the methods disclosed herein may be applied to other devices, including other transistors, such as, for example and without limitation, planar transistors, field effect transistors, nanowire transistors, and the like, without departing from the scope of this disclosure.

Figure 11:
FIG. 11 is a depiction of a substrate with non-deposited to deposited areas.

FIG. 11 is a depiction of a substrate after the selective deposition of a molybdenum precursor when applying the methods of deposition described herein. After the deposition of the substrate using the molybdenum precursor and methods described herein the ration between the deposited verses non deposited areas can be described based on the area deposited on the substrate. For example, and not limited to, for every deposited or precleaned area that is deposited with the molybdenum precursor is greater than $1.3\times10^{16}$ at/cm$^2$ while on the substrate there is less than $6\times10^{14}$ at/cm$^2$ on the non deposited or as received area. In other embodiments the deposited area may be $1.3\times10^{17}$ at/cm$^2$ while on the substrate there is less than $6\times10^{14}$ at/cm$^2$ on the non deposited area. In other embodiments the deposited area may be $1.3\times10^{17}$ at/cm$^2$ while on the substrate there is less than $6\times10^{13}$ at/cm$^2$ on the non deposited area. In other embodiments the deposited area may be $1.3\times10^{16}$ at/cm$^2$ while on the substrate there is less than $6\times10^{13}$ at/cm$^2$ on the non deposited area. The ratios from the deposited and non deposited areas can range based on the substrate, and other factors considered herein.

EXAMPLE 1

Figure 3:
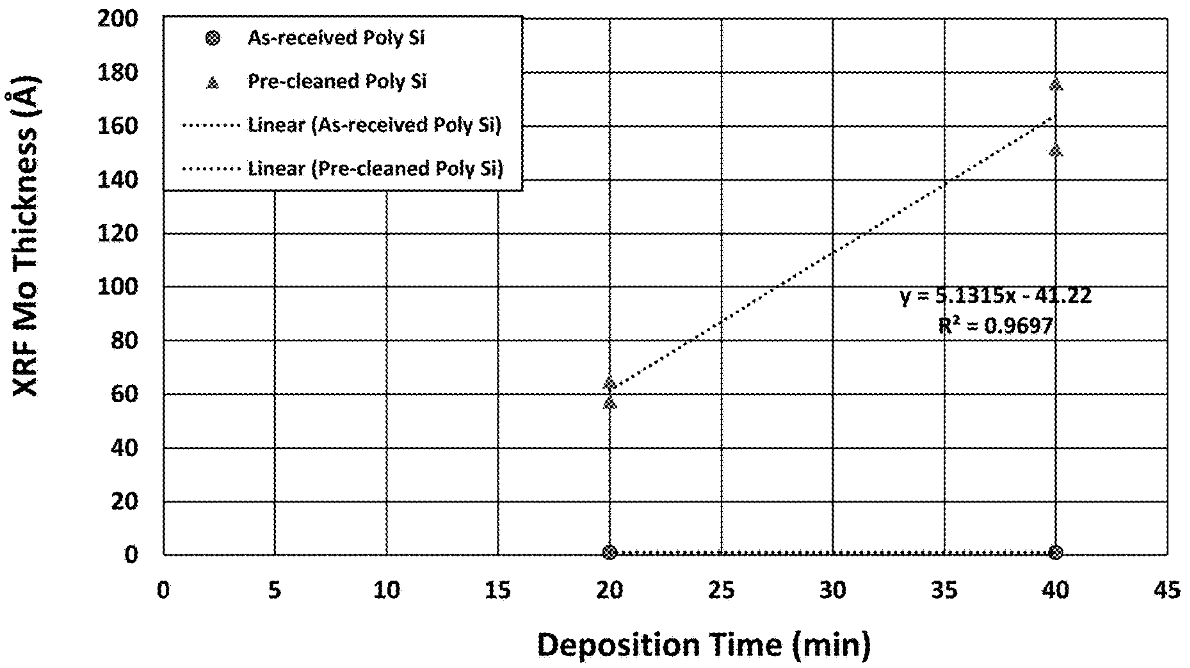
FIG. 3 is a graphical view of molybdenum thickness versus deposition time, as measured by X-ray fluorescence (XRF), according to some embodiments.

Selective Deposition of Molybdenum on Silicon $MoCl_5$ was used to deposit molybdenum selectively on polysilicon. Prior to depositing the molybdenum on the polysilicon, the polysilicon was pre-etched using DHF. FIG. 3 is a graphical view of molybdenum thickness versus deposition time, as measured by X-ray fluorescence (XRF), according to some embodiments. The deposition was performed at 350° C. and 30 Torr pressure, at a flow rate of 500 sccm $H_2$ co-reactant and a flow rate of 0.02 sccm $MoCl_5$. The deposition rate of molybdenum on the DHF pre-etched polysilicon substrate was about 5.1 Å/min. No deposition of molybdenum was detected on the as-received (with native oxides) polysilicon and a Mo thickness of 160 Angstroms was on the pre-etched polysilicon area

EXAMPLE 2

Figure 4:
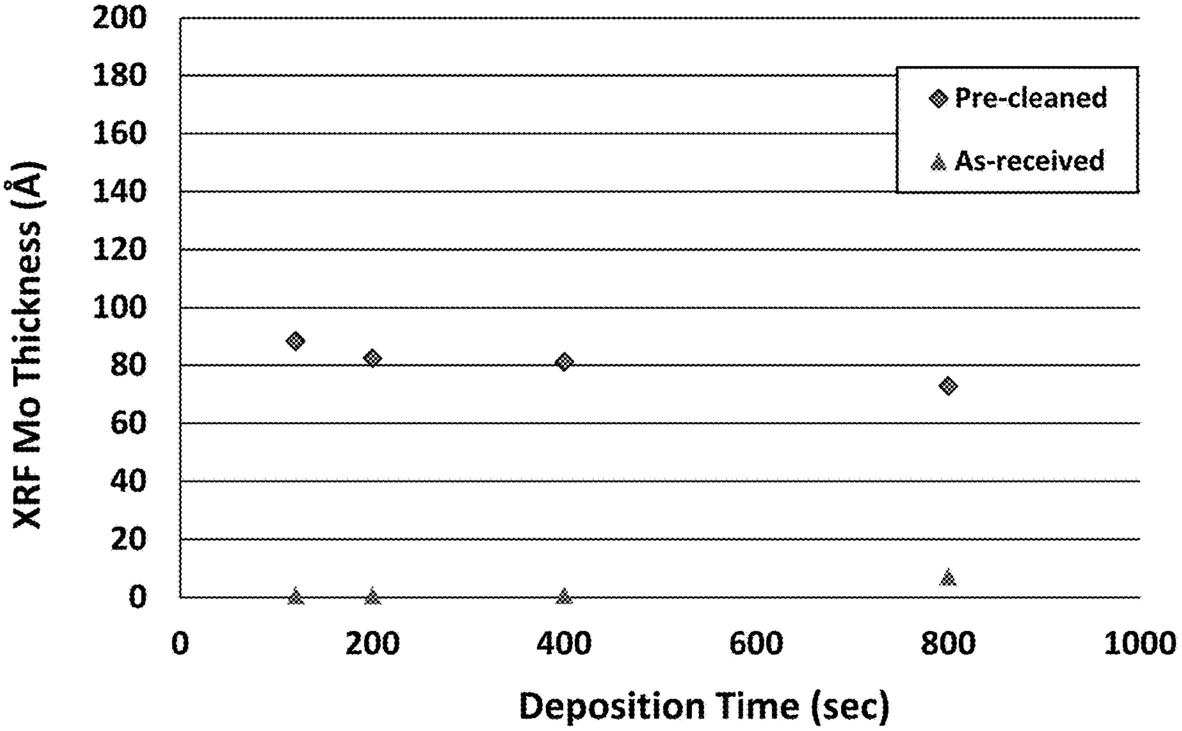
FIG. 4 is a graphical view of molybdenum thickness versus deposition time, as measured by X-ray fluorescence (XRF), according to some embodiments.

Selective Deposition of Molybdenum Silicide on Silicon $MoCl_5$ was used to deposit Molybdenum silicide (MoSix) selectively on a DHF pre-etched polysilicon. FIG. 4 is a graphical view of molybdenum thickness versus deposition time, as measured by X-ray fluorescence (XRF), according to some embodiments. The deposition was performed at 350° C. and 30 Torr pressure, at a flow rate of 500 sccm $H_2$ co-reactant and a flow rate of 0.9 sccm $MoCl_5$. The MoSix thickness on the DHF pre-cleaned polysilicon substrate was limited to about 80 Å. No deposition of molybdenum was detected on the as received (with native oxides) polysilicon until a deposition time of about 800 seconds.

EXAMPLE 3

Deposition of Molybdenum Silicide on Silicon (No Molybdenum Metal Deposition)

Figure 5:
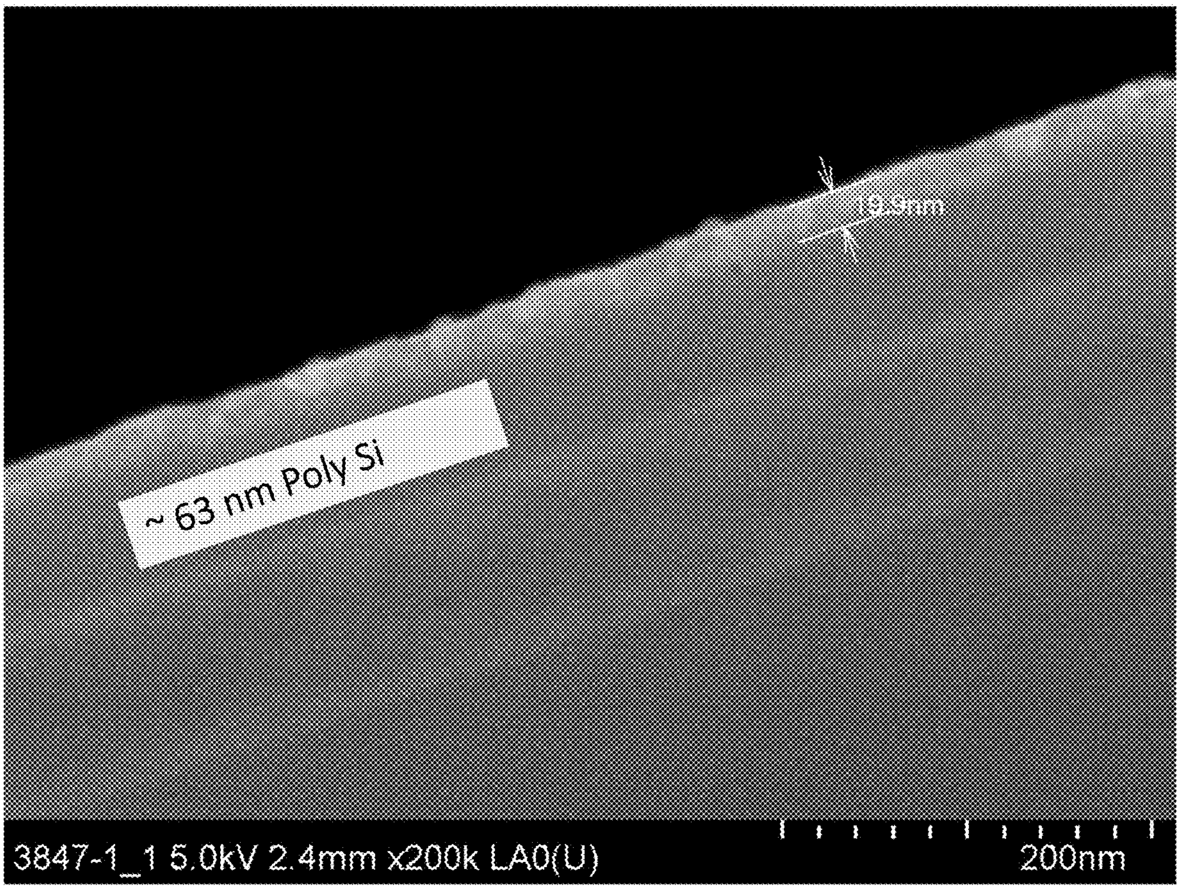
FIG. 5 is a cross-sectional SEM micrograph of a MoSix coated polysilicon sample, according to some embodiments.
Figure 6:
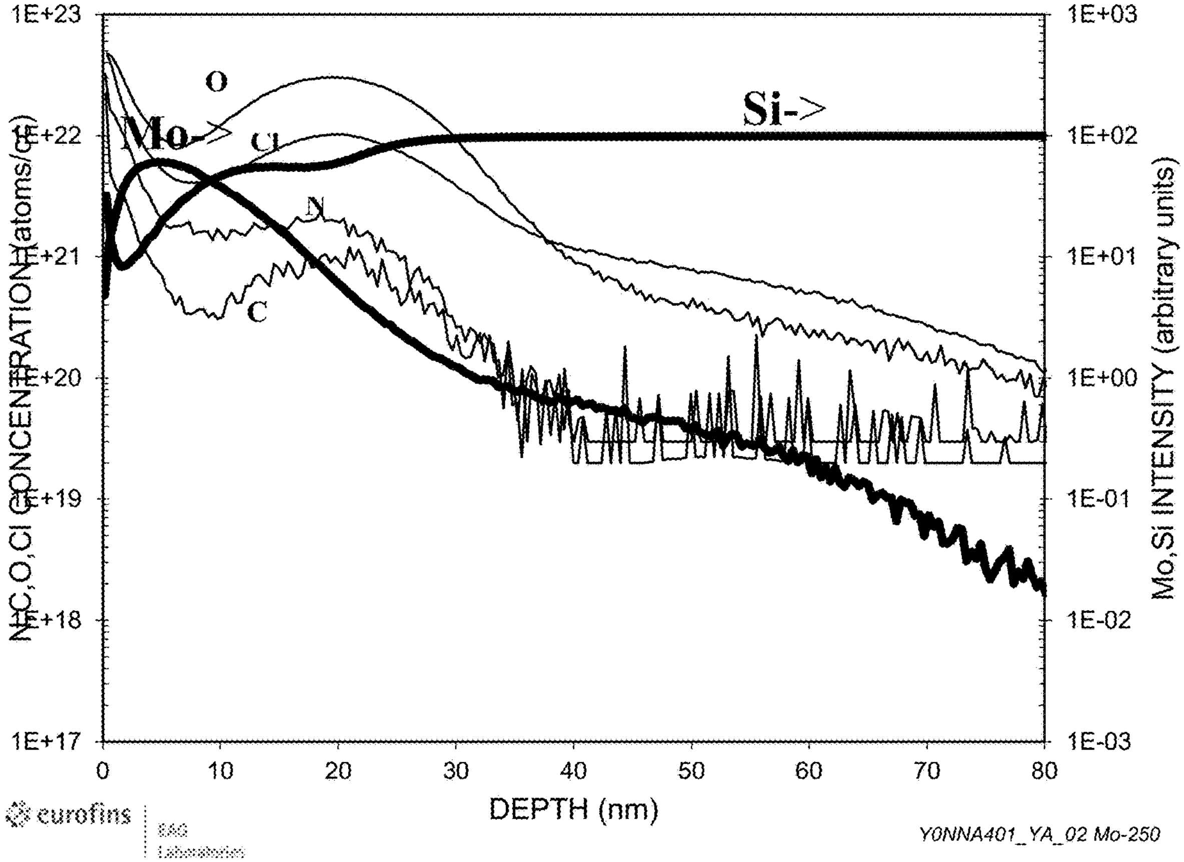
FIG. 6 is a graphical view of a SIMS depth profile of the 200 Å thick coating, according to some embodiments.

FIG. 5 is a cross-sectional SEM micrograph of a MoSix coated polysilicon sample, according to some embodiments. The depicted MoSix coated polysilicon sample was deposited at 350° C. and 30 Torr pressure, at a flow rate of 500 sccm $H_2$ co-reactant and a flow rate of 0.9 sccm $MoCl_5$ for 800 seconds, as shown in FIG. 4. The coating thickness was about 200 Å and the polysilicon substrate thickness was reduced from 800 Å to about 630 Å. Since XRF only detected about 73 Å on the 200 Å thick deposited film the coating was presumed to be MoSix produced by reaction between molybdenum and polysilicon substrate. FIG. 6 is a graphical view of a SIMS depth profile of the 200 Å thick coating, according to some embodiments. The interdiffusion of molybdenum and silicon confirms the formation of MoSix.

EXAMPLE 4

Deposit Molybdenum Metal and Etch Metal Oxides

Figure 7:
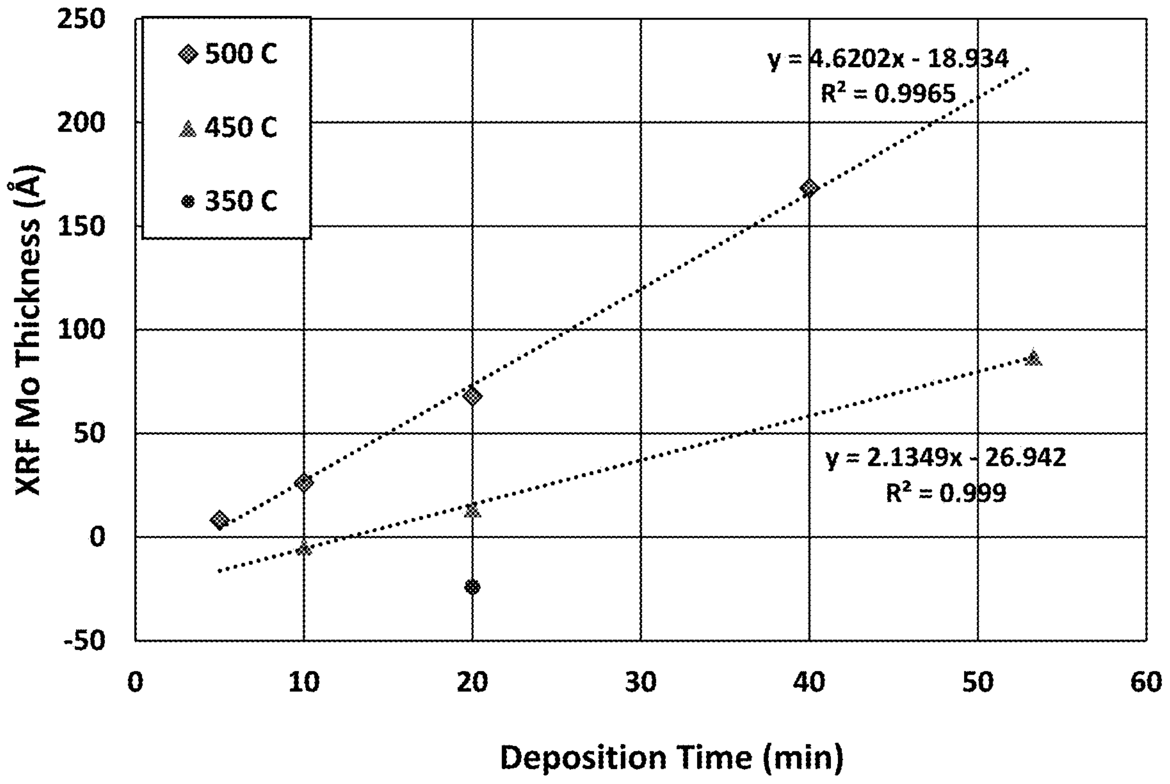
FIG. 7 is a graphical view of molybdenum film thickness versus deposition time, as measured by X-ray fluorescence (XRF), according to some embodiments.
Figure 8:
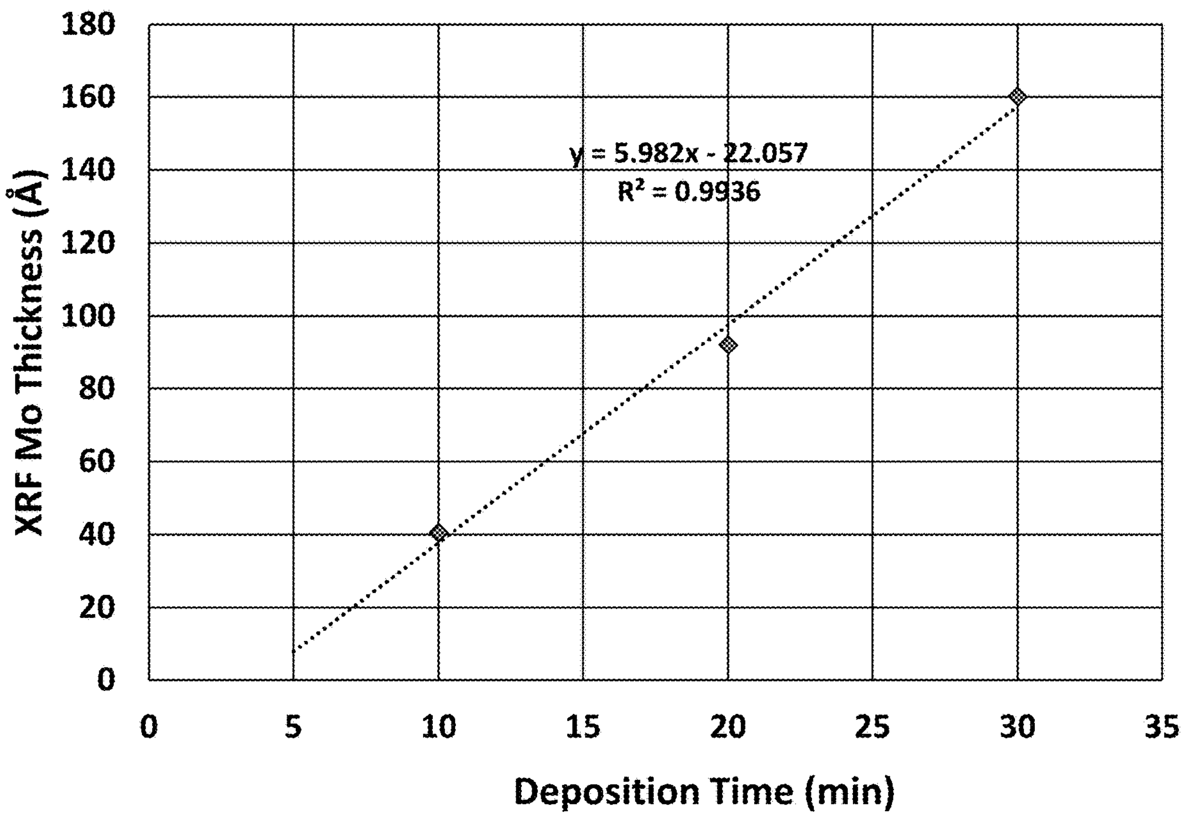
FIG. 8 is a graphical view of molybdenum thickness versus deposition time, as measured by XRF, according to some embodiments.

FIG. 7 is a graphical view of molybdenum film thickness versus deposition time, as measured by X-ray fluorescence (XRF), according to some embodiments. The deposition was performed at different temperatures (i.e., 350° C., 450° C., and 500° C.) and 10 Torr pressure, at a flow rate of 500 sccm $H_2$ co-reactant and a flow rate of 0.02 sccm $MoCl_5$ on PVD molybdenum substrate. At 450° C. the $MoCl_5/H_2$ CVD process etched the molybdenum oxide on the surface in the first 10 minutes before depositing molybdenum. Etching of ~25 Å molybdenum occurred at 350° C. and 10 Torr pressure for 20 minutes. FIG. 8 is a graphical view of molybdenum thickness versus deposition time, as measured by XRF, according to some embodiments. The deposition was performed at 350° C. and 30 Torr pressure, at a flow rate of 500 sccm $H_2$ co-reactant and a flow rate of 0.02 sccm $MoCl_5$. Increasing the deposition pressure to 30 Torr allowed the deposition of molybdenum at 350° C. in 10 minutes.

EXAMPLE 5

Deposition of MoSix then Mo on Silicon

Figure 9:
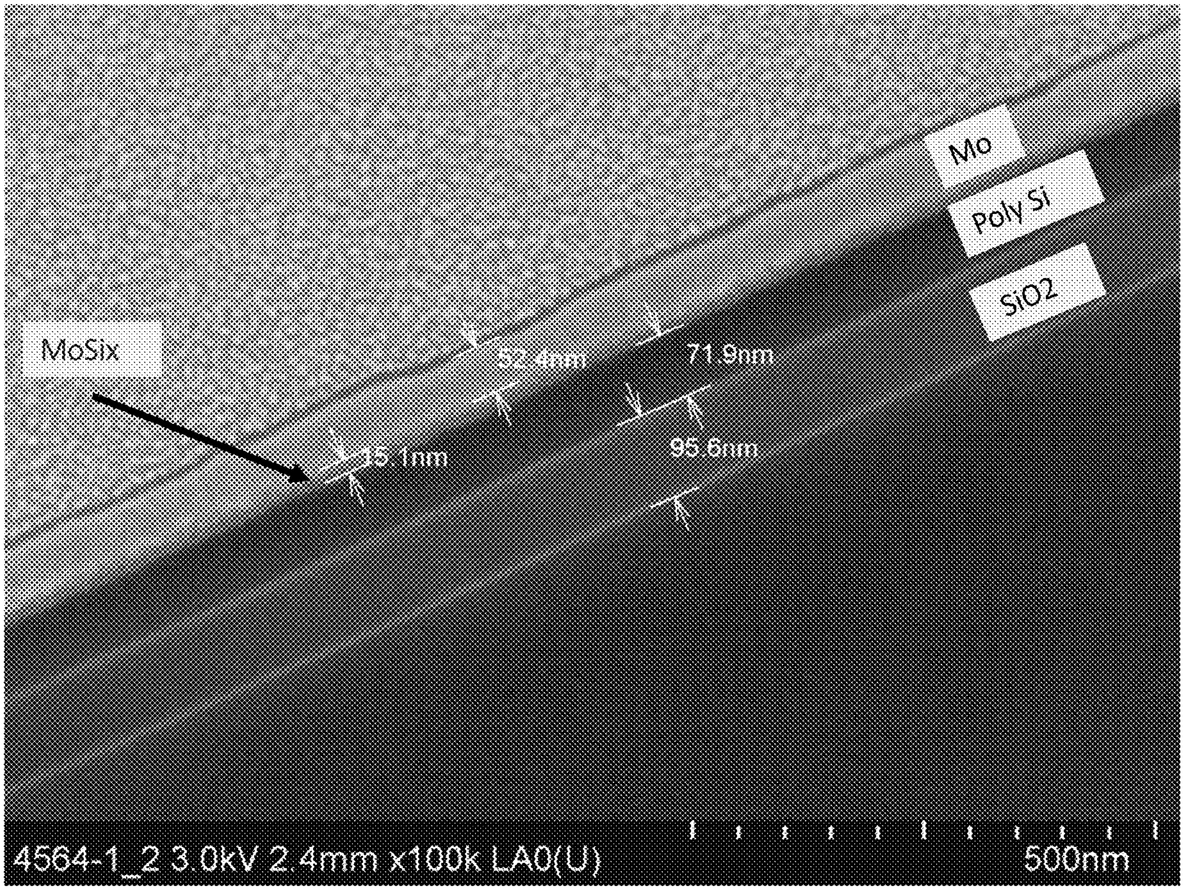
FIG. 9 is a cross-sectional SEM micrograph of a Mo/MoSix coated polysilicon sample, according to some embodiments.
Figure 10:
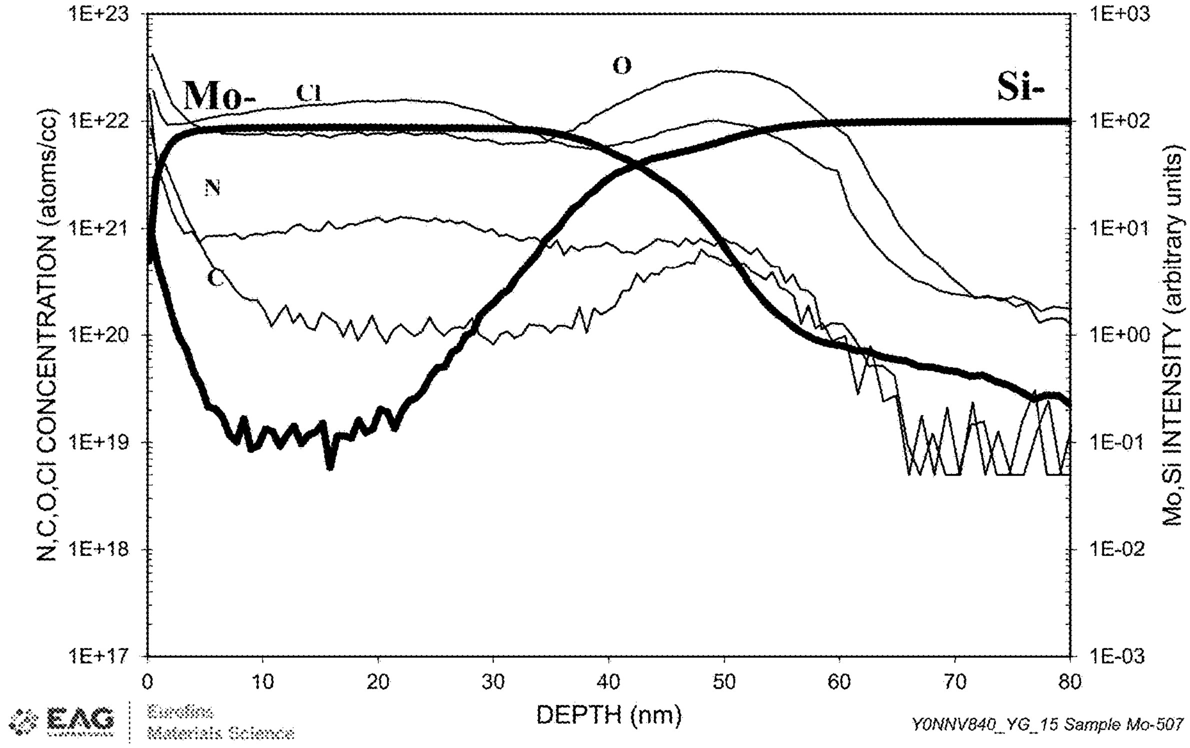
FIG. 10 is a graphical view of a SIMS depth profile of the Mo/MoSix coated polysilicon sample, according to some embodiments.

FIG. 9 is a cross-sectional SEM micrograph of a Mo/MoSix coated polysilicon sample, according to some embodiments. The Mo/MoSix coated polysilicon sample was deposited at 350° C. and 8 Torr pressure, at a flow rate of 500 sccm $H_2$ co-reactant and a flow rate of 0.32 sccm $MoCl_5$ for 800 seconds. About 52 nm of Mo was deposited on top of 15 nm MoSix in one deposition step on a polysilicon substrate. FIG. 10 is a graphical view of a SIMS depth profile of the Mo/MoSix coated polysilicon sample, according to some embodiments. The interdiffusion of Mo and Si confirms the formation of MoSix between Mo and polysilicon substrate. Table 1 lists the conditions ($MoCl_5$ flow rate and chamber pressure) that allowed the formation of Mo/MoSix on polysilicon.

TABLE 1

| Conditions | | | | | |
|---|---|---|---|---|---|
| Sample | Substrate | Chamber P (Torr) | Ar Carrier Flow (sccm) | $MoCl_5$ Flow (sccm) | xSEM/SIMS |
| A | Polysilicon | 30 | 245 | 0.9 | $MoSi_x$ |
| B | Polysilicon | 14 | 100 | 0.86 | $MoSi_x$ |
| C | Polysilicon | 12 | 50 | 0.52 | $Mo/MoSi_x$ |
| D | Polysilicon | 8 | 20 | 0.32 | $Mo/MoSi_x$ |

ASPECTS

Various Aspects are described below. It is to be understood that any one or more of the features recited in the following Aspect(s) can be combined with any one or more other Aspect(s).

Aspect 1. A method comprising:
obtaining a structure,
wherein the structure comprises:
a non-dielectric material; and
a dielectric material;
contacting the structure with a molybdenum precursor under conditions, so as to obtain a molybdenum material on at least a portion of the structure,
wherein the molybdenum material is not deposited on the dielectric material under the conditions.

Aspect 2. The method according to Aspect 1, wherein the non-dielectric material comprises a semiconductor material.

Aspect 3. The method according to any one of Aspects 1-2, wherein the non-dielectric material comprises a conducting material.

Aspect 4. The method according to any one of Aspects 1-3, wherein the molybdenum precursor comprises $MoCl_5$.

Aspect 5. The method according to any one of Aspects 1-4, wherein:
the non-dielectric material comprises silicon;
the molybdenum material comprises molybdenum metal.

Aspect 6. The method according to any one of Aspects 1-5, wherein:
the non-dielectric material comprises silicon; and
the molybdenum material comprises molybdenum silicide.

Aspect 7. The method according to any one of Aspects 1-6, wherein:
the non-dielectric material comprises polysilicon; and
the molybdenum material comprises molybdenum silicide.

Aspect 8. The method according to any one of Aspects 1-7, wherein the conditions comprise a first temperature of 400° C. or less.

Aspect 9. The method according to any one of Aspects 1-8, wherein the conditions comprise a first flow rate of the molybdenum precursor of 0.01 sccm to 10 sccm.

Aspect 10. The method according to any one of Aspects 1-9, wherein the conditions comprise a first pressure of 1 Torr to 100 Torr.

Aspect 11. The method according to any one of Aspects 1-10, further comprising:
contacting the structure with a first co-reactant precursor under the conditions.

Aspect 12. The method according to any one of Aspects 1-11, further comprising:
contacting the structure with the molybdenum precursor under second conditions, so as to obtain a second molybdenum material on at least a portion of the molybdenum material.

Aspect 13. The method according to Aspect 12, wherein contacting the structure with the molybdenum precursor under the second conditions removes metal oxides from the molybdenum material and deposits the second molybdenum material on at least a portion of the non-dielectric material.

Aspect 14. The method according to any one of Aspects 12-13, wherein:
the non-dielectric material comprises silicon;
the molybdenum material comprises molybdenum silicide; and
the second molybdenum material comprises molybdenum metal.

Aspect 15. The method according to any one of Aspects 12-14, wherein:
the non-dielectric material comprises polysilicon;
the molybdenum material comprises molybdenum silicide; and
the second molybdenum material comprises molybdenum metal.

Aspect 16. The method according to any one of Aspects 12-15, wherein the second molybdenum material is not deposited on the dielectric material under the second conditions.

Aspect 17. The method according to any one of Aspects 12-16, wherein the second conditions comprise a second temperature of 400° C. or less.

Aspect 18. The method according to any one of Aspects 12-17, wherein the second conditions comprise a second flow rate of the molybdenum precursor of 0.01 sccm to 10 sccm.

Aspect 19. The method according to any one of Aspects 12-18, wherein the second conditions comprise a second pressure of 1 Torr to 100 Torr.

Aspect 20. The method according to any one of Aspects 12-19, further comprising contacting the structure with a second co-reactant precursor under the second conditions.

Aspect 21. A method comprising:
obtaining a structure,
wherein the structure comprises:
a polysilicon; and
a dielectric material;

contacting the structure with a molybdenum precursor under first conditions, so as to obtain a molybdenum silicide on the polysilicon, contacting the structure with the molybdenum precursor under second conditions, so as to obtain a molybdenum metal on the molybdenum silicide.

Aspect 22. The method according to any one of Aspects 21, wherein the molybdenum silicide is not obtained on the dielectric material under the first conditions.

Aspect 23. The method according to any one of Aspects 21-22, wherein the molybdenum metal is not obtained on the dielectric material under the first conditions.

Aspect 24. The method according to any one of Aspects 21-23, wherein the first conditions comprise a first temperature of 400° C. or less.

Aspect 25. The method according to any one of Aspects 21-24, wherein the first conditions comprise a first flow rate of the molybdenum precursor of 0.01 sccm to 10 sccm.

Aspect 26. The method according to any one of Aspects 21-25, wherein the first conditions comprise a first pressure of 1 Torr to 100 Torr.

Aspect 27. The method according to any one of Aspects 21-26, further comprising contacting the structure with a first co-reactant precursor under the first conditions.

Aspect 28. The method according to any one of Aspects 21-27, wherein the molybdenum silicide is not obtained on the dielectric material under the second conditions.

Aspect 29. The method according to any one of Aspects 21-28, wherein the molybdenum metal is not obtained on the dielectric material under the second conditions.

Aspect 30. The method according to any one of Aspects 21-29, wherein the second conditions comprise a second temperature of 400° C. or less.

Aspect 31. The method according to any one of Aspects 21-30, wherein the second conditions comprise a second flow rate of the molybdenum precursor of 0.01 sccm to 10 sccm.

Aspect 32. The method according to any one of Aspects 21-31, wherein the second conditions comprise a second pressure of 1 Torr to 100 Torr.

Aspect 33. The method according to any one of Aspects 21-32, further comprising contacting the structure with a second co-reactant precursor under the second conditions.

Aspect 34. The method according to any one of Aspects 21-33, further comprising contacting the structure with the molybdenum precursor under third conditions, so as to remove metal oxides on the molybdenum silicide, the molybdenum metal, or the polysilicon.

Aspect 35. The method according to Aspect 34, wherein the molybdenum silicide is not obtained on the dielectric material under the third conditions.

Aspect 36. The method according to any one of Aspects 34-35, wherein the molybdenum metal is not obtained on the dielectric material under the third conditions.

Aspect 37. The method according to any one of Aspects 34-36, wherein the third conditions comprise a third temperature of 400° C. or less.

Aspect 38. The method according to any one of Aspects 34-37, wherein the third conditions comprise a third flow rate of the molybdenum precursor of 0.01 sccm to 10 sccm.

Aspect 39. The method according to any one of Aspects 34-38, wherein the third conditions comprise a third pressure of 1 Torr to 100 Torr.

Aspect 40. The method according to any one of Aspects 21-39, wherein the first conditions and the second conditions are the same, such that the molybdenum silicide is obtained on the polysilicon and such that the molybdenum metal is obtained on the molybdenum silicide in a single step.

Aspect 41. A method comprising:

obtaining a structure, wherein the structure comprises:

a conducting material; and a dielectric material;

contacting the structure with a molybdenum precursor under first conditions, wherein the molybdenum precursor removes a molybdenum oxide from at least a portion of the conducting material under the first conditions, contacting the structure with the molybdenum precursor under second conditions, wherein the molybdenum precursor deposits a molybdenum metal on at least a portion of the conducting material under second conditions.

Aspect 42. The method according to Aspect 41, wherein the molybdenum metal is not obtained on the dielectric material under the conditions.

Aspect 43. The method according to any one of Aspects 41-42, wherein the first conditions comprise a temperature of 400° C. or less; wherein the second conditions comprise a temperature of 400° C. or less.

Aspect 44. The method according to any one of Aspects 41-43, wherein the first conditions comprise a flow rate of the molybdenum precursor of 0.01 sccm to 1 sccm; wherein the second conditions comprise a flow rate of the molybdenum precursor of 0.1 sccm to 1 sccm.

Aspect 45. The method according to any one of Aspects 41-44, wherein the first conditions comprise a first pressure, wherein the second conditions comprise a second pressure; wherein the second pressure is greater than the first pressure.

Aspect 46. The method according to Aspect 45, wherein the first pressure is a pressure of 1 Torr to 100 Torr.

Aspect 47. The method according to Aspect 46, wherein the second pressure is a pressure of 1 Torr to 100 Torr.

Aspect 48. The method according to any one of Aspects 41-47, wherein the conducting material comprise molybdenum silicide.

Aspect 49. The method according to any one of Aspects 41-48, wherein the conducting material comprises a metal.

Aspect 50. The method according to any one of Aspects 41-49, wherein the conducting material comprises a metal nitride.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A method comprising:

obtaining a structure, wherein the structure comprises:

an exposed non-dielectric material, and an exposed dielectric material;

contacting the structure with a molybdenum precursor under conditions, so as to obtain a molybdenum material on at least a portion of the non-dielectric material, wherein the molybdenum material is not deposited on the dielectric material under the conditions, and wherein the molybdenum precursor preferentially deposits on the non-dielectric material over the dielectric material under the conditions.

2. The method according to claim 1, wherein the non-dielectric material comprises a semiconductor material.

3. The method according to claim 1, wherein the non-dielectric material comprises a conducting material.

4. The method of claim 1, wherein the molybdenum precursor comprises $MoCl_5$.

5. The method of claim 1, wherein:
the non-dielectric material comprises silicon; and
the molybdenum material comprises molybdenum metal.

6. The method of claim 1, wherein:
the non-dielectric material comprises silicon; and
the molybdenum material comprises molybdenum silicide.

7. The method of claim 1, wherein:
the non-dielectric material comprises polysilicon; and
the molybdenum material comprises molybdenum silicide.

8. The method of claim 1, wherein the conditions comprise a first temperature of 400° C. or less.

9. The method of claim 1, wherein the conditions comprise a first flow rate of the molybdenum precursor of 0.01 sccm to 10 sccm.

10. The method of claim 1, wherein the conditions comprise a first pressure of 1 Torr to 100 Torr.

11. The method of claim 1, further comprising contacting the structure with a first co-reactant precursor under the conditions.

12. The method of claim 1, further comprising:
contacting the structure with the molybdenum precursor under second conditions, so as to obtain a second molybdenum material on at least a portion of the molybdenum material.

13. The method of claim 12, wherein contacting the structure with the molybdenum precursor under the second conditions removes metal oxides from the molybdenum material and deposits the second molybdenum material on at least a portion of the non-dielectric material.

14. A method comprising:
obtaining a structure,
wherein the structure comprises:
a polysilicon, and
a dielectric material;
contacting the polysilicon with a molybdenum precursor under first conditions, so as to obtain a molybdenum silicide on the polysilicon; and
contacting the structure with the molybdenum precursor under second conditions, so as to obtain a molybdenum metal on the molybdenum silicide.

15. The method of claim 14, wherein the molybdenum silicide is not obtained on the dielectric material under the first conditions.

16. The method of claim 14, wherein no molybdenum material is obtained on the dielectric material under the first conditions or under the second conditions.

17. The method of claim 14, wherein the first conditions comprise a first temperature of 400° C. or less.

18. The method of claim 14, wherein the first conditions comprise a first flow rate of the molybdenum precursor of 0.01 sccm to 10 sccm.

19. The method of claim 14, wherein the first conditions comprise a first pressure of 1 Torr to 100 Torr.

20. A semiconductor structure comprising,
a polysilicon;
a dielectric material; and
a molybdenum silicide on the polysilicon, wherein the molybdenum silicide and the polysilicon exhibit interdiffusion.

21. The method of claim 14, wherein the molybdenum precursor reacts with the polysilicon to form the molybdenum silicide.

22. The method of claim 14, wherein the molybdenum silicide and the polysilicon exhibit interdiffusion.

23. The method of claim 14, wherein a thickness of the polysilicon is reduced by the contacting under the first conditions.

24. The semiconductor structure of claim 20, wherein the molybdenum silicide is not on the dielectric material.

25. The semiconductor structure of claim 20, further comprising a molybdenum metal on the molybdenum silicide.

26. The semiconductor structure of claim 20, wherein the semiconductor structure comprises a transistor, and wherein the polysilicon comprises a source, a drain, or both.

* * * * *